(12) United States Patent
Karl et al.

(10) Patent No.: US 6,484,307 B2
(45) Date of Patent: Nov. 19, 2002

(54) METHOD FOR FABRICATING AND CHECKING STRUCTURES OF ELECTRONIC CIRCUITS IN A SEMICONDUCTOR SUBSTRATE

(75) Inventors: Jürgen Karl, München (DE); Martin Zibert, Feldkirchen-Westerham (DE); Valentin Rosskopf, Poettmess-Schorn (DE)

(73) Assignee: Infineon Technologies AG, München (DE)

( * ) Notice: Subject to any disclaimer, the term of this patent is extended or adjusted under 35 U.S.C. 154(b) by 44 days.

(21) Appl. No.: 09/811,867

(22) Filed: Mar. 19, 2001

(65) Prior Publication Data

US 2002/0016693 A1 Feb. 7, 2002

(30) Foreign Application Priority Data

Mar. 17, 2000 (DE) .......................... 100 14 914

(51) Int. Cl.$^7$ ................................ G06F 17/50
(52) U.S. Cl. ................... 716/21; 716/2; 716/4
(58) Field of Search ............... 716/2, 4, 5, 11, 716/19, 20, 21

(56) References Cited

U.S. PATENT DOCUMENTS

| | | | | |
|---|---|---|---|---|
| 5,097,422 A | * | 3/1992 | Corbin et al. | 364/491 |
| 5,350,704 A | * | 9/1994 | Anderson et al. | 437/51 |
| 6,345,379 B1 | * | 2/2002 | Khouja et al. | 716/4 |

FOREIGN PATENT DOCUMENTS

DE    197 17 791 A1    11/1998    ......... H01L/23/544

\* cited by examiner

*Primary Examiner*—Don Wong
*Assistant Examiner*—Jimmy T. Vu
(74) *Attorney, Agent, or Firm*—Laurence A. Greenberg; Werner H. Stemer; Ralph E. Locher

(57) ABSTRACT

A method for fabricating and checking at least two structures of an electronic circuit in a semiconductor substrate. By using two different masks, in two method steps, identical configurations of first and second structures are produced in useful areas of the semiconductor substrate. In the scribe lines, bordering the useful area, only first structures are produced using the first mask and only second structures are produced using the second mask.

9 Claims, 3 Drawing Sheets

METHOD FOR FABRICATING AND CHECKING STRUCTURES OF ELECTRONIC CIRCUITS IN A SEMICONDUCTOR SUBSTRATE

BACKGROUND OF THE INVENTION

Field of the Invention

The invention relates to a method for fabricating and checking at least two structures of an electronic circuit in a semiconductor substrate.

Electronic circuits of this type are typically formed as integrated circuits on a wafer, preferably a silicon wafer. The integrated circuits may be formed as dynamic random access memory (DRAM) cells, for example. A wafer contains an areal configuration of a multiplicity of DRAM cells of this type, which are formed as chips. The chip areas of the individual chip form the useful areas of the wafer. The individual useful areas are bordered by scribe lines, so-called kerfs. Electronic circuits that are used to check the functionality and reliability of the electronic circuits on the individual chip areas are situated in the scribe lines.

Chips with standard DRAM cells usually have a configuration of transistors having a specific gate oxide thickness. In order to check these transistors, structurally identical transistors are disposed in the scribe lines. These transistors in the scribe line form monitoring and reliability structures that are used for carrying out predetermined measurement and test steps. Statements about the functionality and reliability of the transistors on the chip areas of the individual chips can be derived from the measurement and test steps.

In order to obtain statistical statements that are as reliable as possible during the measurement and test steps, it is desirable to place the largest possible number of transistors in the scribe lines. However, the maximum number of transistors in the scribe lines is limited by the fact that the chip yield per wafer should be as high as possible. This limits the available area of the scribe lines and hence the number of transistors placed there.

In the case of novel DRAM cells required for RAMBUS chips, for example, transistors having a plurality (preferably two) of different gate oxide thicknesses are required on account of the performance and reliability to be achieved for such elements.

Accordingly, in order to check these structures, transistors having both small and large gate oxide thicknesses have to be provided in the scribe lines in order that the functionality and reliability of both structures can be checked.

In order that, in comparison with standard DRAM cells, for each kind of transistors the same number is available in the scribe lines, the areas of the scribe lines would have to be enlarged, which would lead to an undesirable reduction of the chip areas.

SUMMARY OF THE INVENTION

It is accordingly an object of the invention to provide a method for fabricating and checking structures of electronic circuits in a semiconductor substrate that overcomes the above-mentioned disadvantages of the prior art methods of this general type, which ensures that different structures of an electronic circuit in a semiconductor substrate are checked as reliably as possible, without the useful area of the substrate being restricted.

With the foregoing and other objects in view there is provided, in accordance with the invention, a method for fabricating and checking at least two structures of an electronic circuit in a semiconductor substrate. The method includes using a first mask having a plurality of first parts for defining first useful areas and first scribe lines bordering the first useful areas. The first mask extends over first regions of the semiconductor substrate. First and second structures are produced in the first useful areas according to a predetermined pattern. Further ones of the first structures are produced in the first scribe lines. A second mask having a plurality of second parts is used for defining second useful areas and second scribe lines bordering the second useful area, the second mask extends over second regions of the semiconductor substrate. The first and second structures are produced in the second useful areas according to the predetermined pattern and further ones of the second structures are produced in the second scribe lines. The first structures in the first scribe lines and the second structures in the second scribe lines are used for checking the first and second structures in the first useful areas and the second useful areas.

The method for fabricating and checking at least two structures of an electronic circuit in a semiconductor substrate, teaches the use of a first mask. The first mask defines a configuration of useful areas and scribe lines bordering the latter and extends over first regions of the semiconductor substrate. According to a predetermined pattern, the first and second structures are produced in the useful areas and the first structures are produced in the scribe lines.

The second mask defines a configuration of useful areas and scribe lines bordering the latter and extends over second regions of the semiconductor substrate. According to the predetermined pattern, the first and second structures are produced in the useful areas and the second structures are produced in the scribe lines.

The first structures in the scribe lines of the first regions and the second structures in the scribe lines of the second regions are in each case used for checking the first and second structures in the useful areas.

The basic concept of the invention is that, using the two masks in the respective first or second regions, identically formed first and second structures are produced in the useful areas, but either only first or only second structures are produced in the scribe lines.

In this case, the first and second regions are distributed alternately and preferably in a chessboard-like manner over the entire surface of the semiconductor substrate. In the first regions, only the first structures are disposed in the scribe lines, so that only first structures are checked in these regions, although both first and second structures are situated in the assigned useful areas. Correspondingly, only the second structures are disposed in the second regions, so that only the functionality of the second structures can be checked there, although both first and second structures are situated in the assigned useful areas of the second regions.

By virtue of this configuration, the first and second structures are tested separately in separate regions. One essential advantage is that in each case only one structure of electronic circuits is present in all scribe lines of both regions, with the result that the number of structures in a scribe line can be kept small. Therefore, the area of the scribe lines can be given correspondingly small dimensions and the useful areas can be given correspondingly large dimensions, thereby obtaining a correspondingly high yield in the fabrication of electronic circuits on the semiconductor substrate.

At the same time, the complementary configuration of the first and second structures in the scribe lines of the first and second regions ensures that the reliability and functionality of both structures can be checked with a sufficiently high process dependability. The chessboard-like configuration of the first and second regions is particularly advantageous in this case. In this way, the first and second structures in the respective scribe line are distributed uniformly over the surface of the semiconductor substrate, with the result that the surface of the semiconductor substrate is in each case covered uniformly during the checking of the first and second structures.

In a particularly advantageous manner, the two masks are used for forming the first and second structures only during a technology starting phase. During a technology starting phase for products produced with the semiconductor substrates, there is an increased requirement for measurement and test steps for the products in order to test the reliability of the products to a sufficient extent.

In a product phase following the technology starting phase, there is a comparatively reduced requirement for measurement and test steps.

In this case, instead of using two masks for fabricating the first and second structures, it is possible to use a single modified first mask.

The modified first mask is not divided into first and second parts. Rather, the mask is formed in such a way that the first and second structures are produced in all useful areas. In each case a predetermined number of first and second structures are produced in the scribe lines, with the result that both structures are then tested simultaneously in a scribe line.

In an advantageous embodiment of the invention, the first and second structures are formed by different gate oxide thicknesses of transistors that are preferably used in DRAM memory cells.

In accordance with an added mode of the invention, there is the step of using the first mask for fabricating first transistors having a first gate oxide thickness. The first mask is formed such that a nitrogen implantation is carried out in gate oxide regions of the first transistors prior to an application of a gate oxide layer, which implantation inhibits a growth of the gate oxide layer subsequently applied.

In accordance with another mode of the invention, there is the step of using the second mask for fabricating second transistors having a second gate oxide thickness being greater than the first gate oxide thickness. The second mask is formed in such a way that no nitrogen implantation is carried out in gate oxide regions of the second transistors prior to an application of the gate oxide layer.

In accordance with a further mode of the invention, there is the step of forming the electronic circuits in the semiconductor substrate to be dynamic random access memory (DRAM) structures in a silicon wafer.

Other features which are considered as characteristic for the invention are set forth in the appended claims.

Although the invention is illustrated and described herein as embodied in a method for fabricating and checking structures of electronic circuits in a semiconductor substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
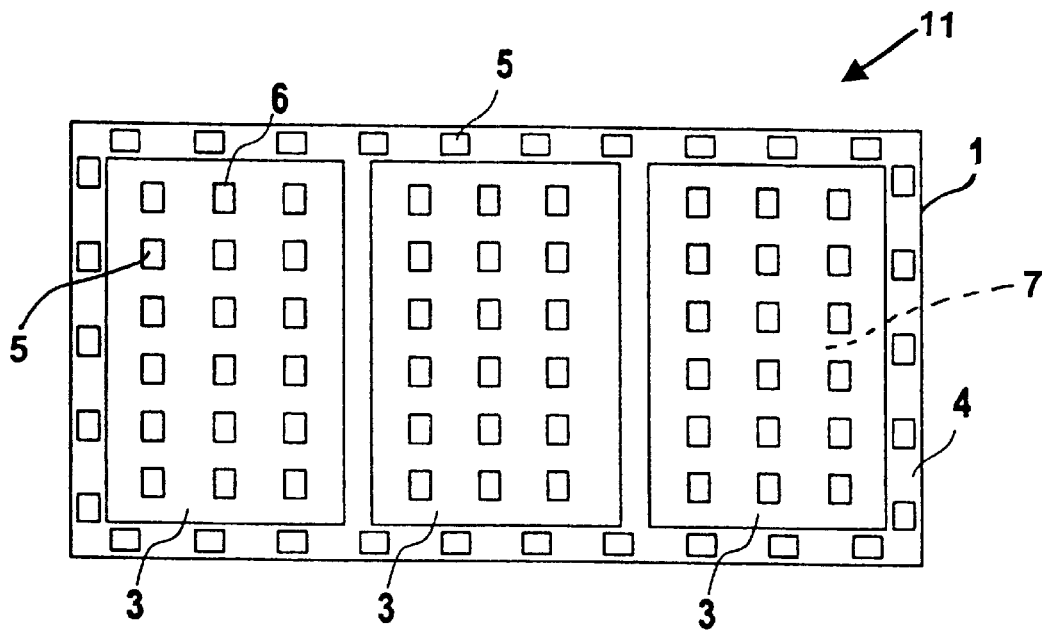
FIG. 1 is a diagrammatic illustration of a first part of a first mask for fabricating structures of electronic circuits in a semiconductor substrate according to the invention.
Figure 2:
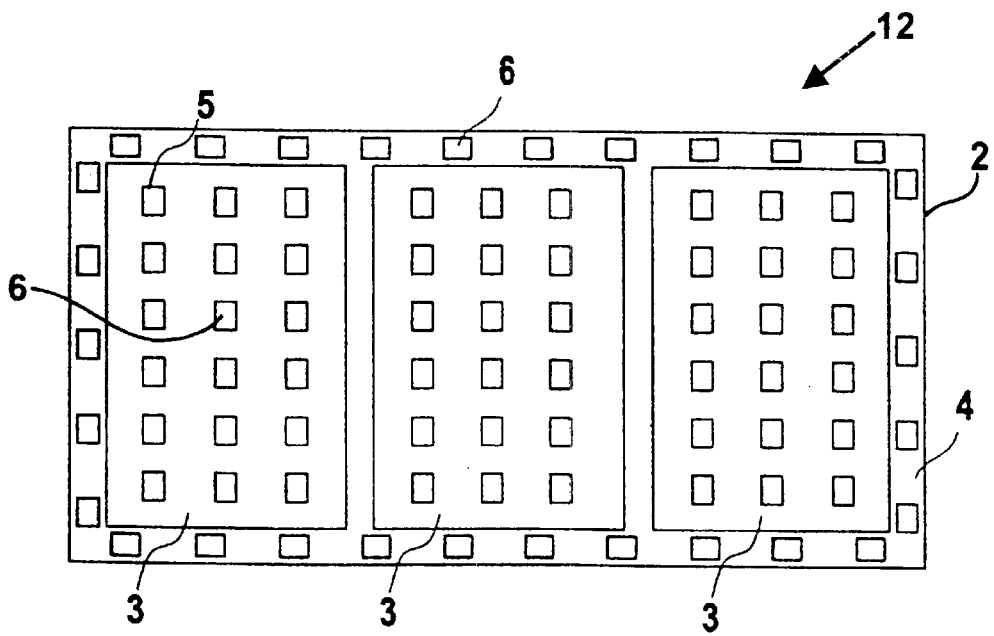
FIG. 2 is a diagrammatic illustration of a second part of a second mask for fabricating the structures of the electronic circuits.

In all the figures of the drawing, sub-features and integral parts that correspond to one another bear the same reference symbol in each case. Referring now to the figures of the drawing in detail and first, particularly, to FIGS. 1 and 2 thereof, there is shown diagrammatically two masks 11, 12 that serve for fabricating electronic circuits in a semiconductor substrate 7. In this case, a first mask 11 contains a plurality of first parts 1 in accordance with FIG. 1. A second mask 12 contains a plurality of second parts 2 in accordance with FIG. 2. Each part 1, 2 of the mask 11, 12 and hence a surface of the semiconductor substrate 7 is subdivided into a grid of useful areas 3 bordered by scribe lines 4. Two different structures 5, 6 of electronic circuits, the configuration of which is diagrammatically illustrated in FIGS. 1 and 2, are produced in the zones of the individual useful areas 3 and the scribe lines 4.

The semiconductor substrate 7 is a silicon wafer 7 used for fabricating DRAM cells. A large number of identically formed chips are obtained from the silicon wafer 7. Each of the chips contains configurations of the DRAM cells and preferably forms a RAMBUS or the like.

In the case of chips of this type, different structures 5, 6 of electronic circuits are required, in particular, which are formed as transistors having different gate oxide thicknesses.

In the present exemplary embodiment, two different transistors are provided, a first type of the transistors forming a first structure 5 have a thin gate oxide layer and a second type of the transistors forming a second structure 6 have a thick gate oxide layer.

The different first and second structures 5, 6 are produced using the masks 11, 12 in accordance with FIGS. 1 and 2.

In order to produce the first structures 5, a nitrogen implantation is carried out in the gate oxide regions of the respective transistors. For this purpose, the nitrogen is implanted into the semiconductor substrate 7 through corresponding openings in the masks 11, 12 in accordance with FIGS. 1 and 2. By contrast, the masks 11, 12 in accordance with FIGS. 1 and 2 are formed in such a way that the gate oxide regions of the gate oxide regions forming the second structures 6 are covered during the nitrogen implantation.

After the nitrogen implantation, the oxide layers forming the gate oxide layers are applied to the semiconductor substrate 7. In the case of the nitrogen-implanted gate oxide regions of the transistors forming the first structures 5, the oxide layers grow in a retarded and inhibited manner due to the nitrogen, with the result that thin gate oxide layers are obtained. By contrast, thick gate oxide layers are obtained for the non-nitrogen-implanted gate oxide regions of the transistors forming the second structures 6.

The regions 1, 2 of the first and second masks 11, 12 illustrated in FIGS. 1 and 2 each have an identical construction. In the present example, each region 1, 2 contains three useful areas 3, which correspond to the chip carriers of the chips to be produced. The useful areas 3 are bordered by the scribe line 4. A width of the scribe line 4 is considerably smaller than the width of the useful area 3. In the present exemplary embodiment, the chip areas have a rectangular cross-section, the scribe line 4 bordering them having a likewise rectangular contour.

The individual chips obtained from the semiconductor substrate 7 are formed identically. Accordingly, all the useful areas 3 of the parts 1, 2 of the masks 11, 12 in accordance with FIGS. 1 and 2 have identical patterns which are used to produce in each case identical configurations of transistors having thick and thin gate oxide layers.

The parts 1, 2 of the first and second masks 11, 12 illustrated in FIGS. 1 and 2 differ through the formation of test structures in the scribe lines 4.

As is evident from FIG. 1, the scribe line 4 of the first mask 11 is formed in such a way that only transistors forming the first structures 5 and having thin gate oxide layers are disposed there.

By contrast, the scribe line 4 of the second mask 12 in accordance with FIG. 2 is formed in such a way that only transistors forming the second structures 6 and having thick gate oxide layers are disposed there.

For checking the reliability and functionality, predetermined measurements and test steps are carried out using the transistors located in the zones of the scribe lines 4.

Since only transistors having thin gate oxide layers are produced in the zone of the scribe line 4 of the first region 1 of the first mask, only the first structures 5, but not the second structures 6, are checked during the checking process.

Correspondingly, only transistors having thick gate oxide layers are produced in the zone of the scribe line 4 of the second region 2 of the second mask, with the result that only the second structures 6 are checked there.

The first mask 11 contains a configuration of the first parts 1, which are disposed complementarily to the configuration of the second parts 2 of the second mask 12.

Consequently, in a first method step, the first and second structures 5, 6 can be produced using the first parts 1 of the first mask 11 in first partial zones of the wafer 7. In a second method step, the first and second structures 5, 6 are in turn produced using the second parts 2 of the second mask 12 in the partial zones of the wafer 7 which are not processed during the first method step.

Figure 3:
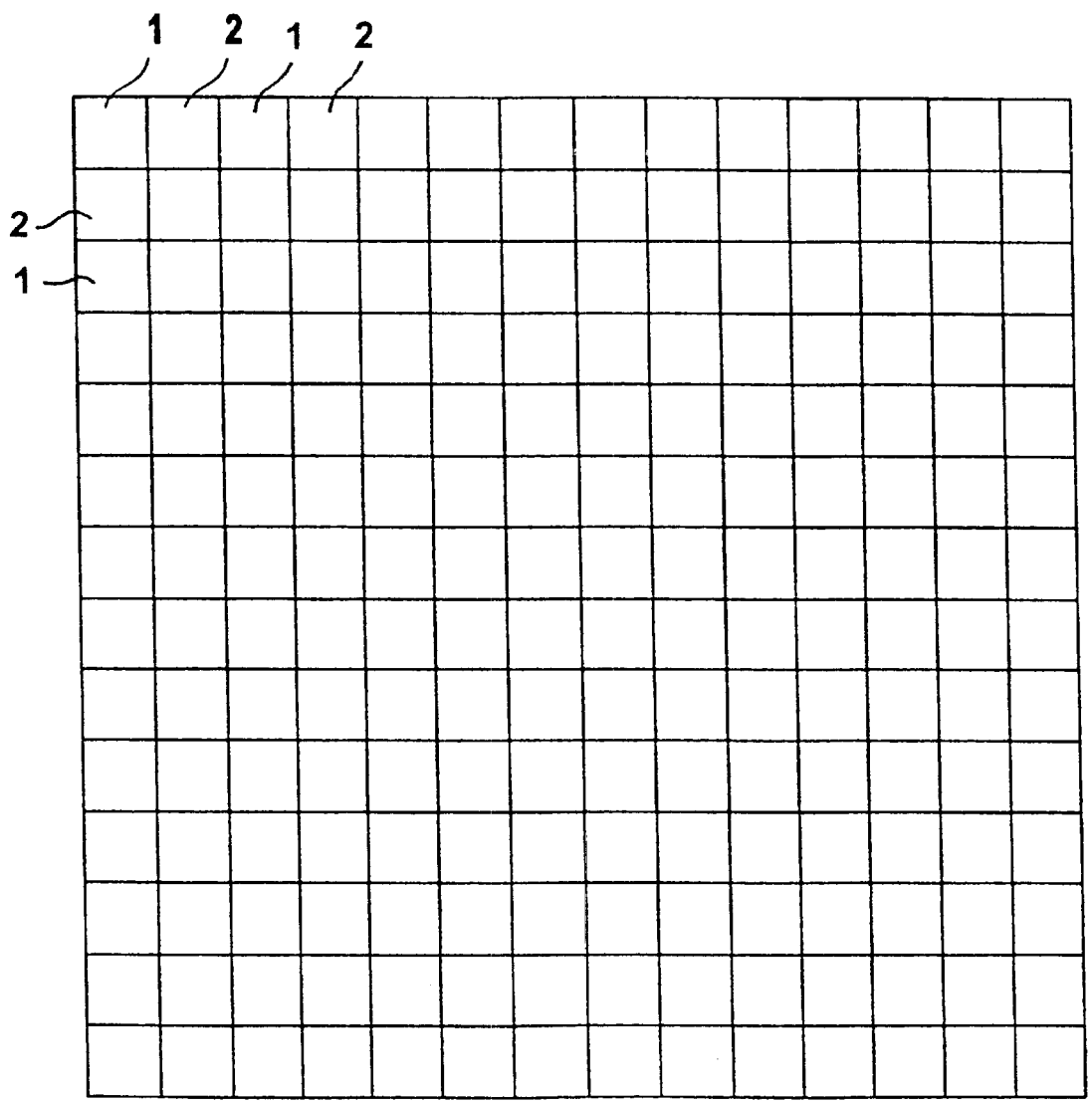
FIG. 3 is a diagrammatic illustration of a distribution of first mask in accordance with FIG. 1 and of the second mask in accordance with FIG. 2 over a surface of the semiconductor substrate.

In this case, the first and second parts 1, 2 of the first and second masks 11, 12 are disposed in such a way that these cover the surface of the wafer 7 in an alternate configuration. FIG. 3 shows an exemplary embodiment of a configuration of this type, in which the first parts 1 of the first mask 11 and the second parts 2 of the second mask 12 cover the wafer surface, formed of first regions covered by the first mask and second regions covered by the second mask 12, like a chessboard.

The first and second structures 5, 6 are checked spatially separately in the first and second parts 1, 2 of the two masks 11, 12, which are distributed uniformly over the wafer surface.

A configuration of this type is advantageous in particular because in each of the zones of the scribe lines 4 a sufficiently large number of the first or second structures 5, 6 are produced to obtain a reliable statistical evaluation of the individual measurement quantities. At the same time, the total number of first or second structures 5, 6 in the zones of the scribe lines 4 is small enough that the total area of the scribe line 4 can be kept small.

The two masks 11, 12 are used in particular during a technology starting phase in which, prior to the series release of the checks fabricated from the wafers, extensive and detailed checks of the first and second structures 5, 6 have to be carried out.

In the production phase following the technology starting phase, the two masks 11, 12 are preferably used only sporadically for a few production batches.

A modified first mask 11' is used instead of the two masks. A part 1' of the modified first mask 11' is illustrated in FIG. 4.

The part 1' has the useful areas 3, in which the patterns of the first and second structures 5, 6 are once again produced.

The useful areas 3 are identical to the useful areas 3 of the two masks 11, 12 in accordance with FIGS. 1 and 2.

Figure 4:
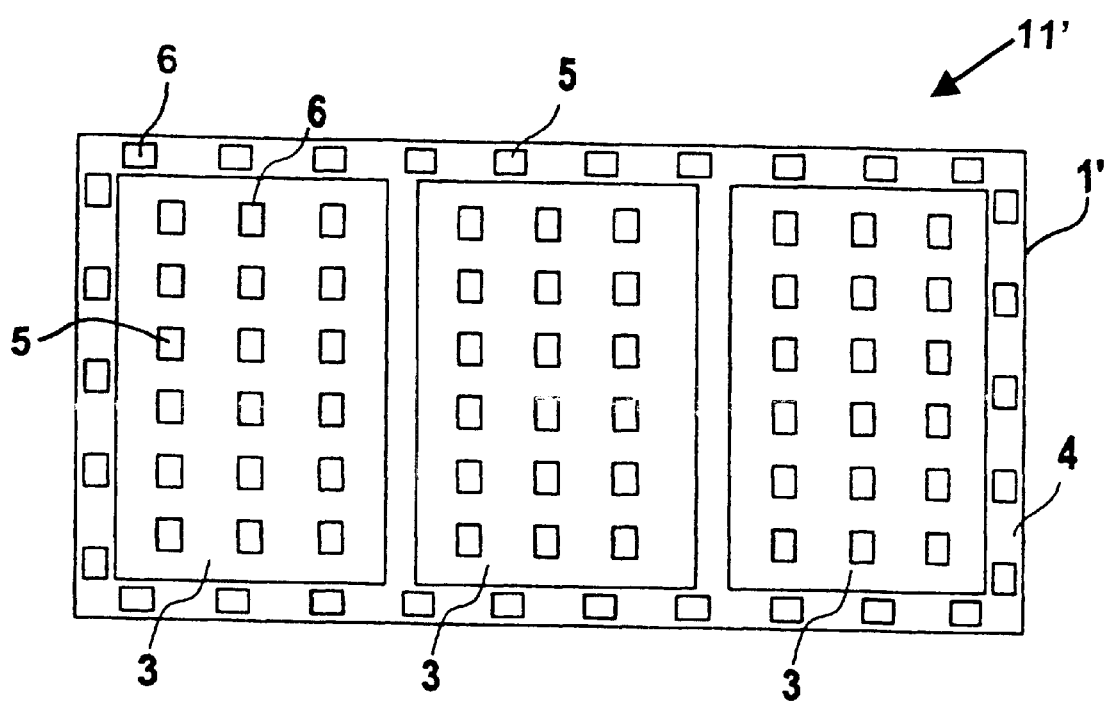
FIG. 4 is a diagrammatic illustration of a modified first mask for fabricating the structures of the electronic circuits in the semiconductor substrate.

In contrast to the masks 11, 12 in accordance with FIGS. 1 and 2, in the case of the mask 11' in accordance with FIG. 4, in each case a predetermined number of the first and second structures 5, 6 are produced in the scribe line 4. A total number of these structures corresponding to the total number of structures in the scribe line 4 of the first and second masks in accordance with FIGS. 1 and 2.

In the present exemplary embodiment, using the mask 11' in accordance with FIG. 4, predominantly transistors forming the first structures 5 and having thin gate oxide layers are produced in the zone of the scribe lines 4, whereas only a small number of the second structures 6 are produced.

We claim:

1. A method for fabricating and checking at least two structures of an electronic circuit in a semiconductor substrate, which comprises the method steps of:

using a first mask having a plurality of first parts for defining first useful areas and first scribe lines bordering the first useful areas, the first mask extending over first regions of the semiconductor substrate;

producing first and second structures in the first useful areas according to a predetermined pattern;

producing further ones of the first structures in the first scribe lines;

using a second mask having a plurality of second parts for defining second useful areas and second scribe lines bordering the second useful area, the second mask extending over second regions of the semiconductor substrate;

producing the first and second structures in the second useful areas according to the predetermined pattern;

producing further ones of the second structures in the second scribe lines; and using the first structures in the first scribe lines and the second structures in the second scribe lines for checking the first and second structures in the first useful areas and the second useful areas.

2. The method according to claim 1, which comprises disposing the first parts and the second parts alternately and extending over an entire surface of the semiconductor substrate.

3. The method according to claim 2, which comprises disposing the first parts and the second parts over the surface of the semiconductor substrate in a chessboard like fashion.

4. The method according to claim 1, which comprises using the first mask and the second mask during a technology starting phase.

5. The method according to claim 4, which comprises performing a production phase following the technology starting phase, in which the first mask and the second mask are used only for sporadically testing selected batches of semiconductor substrates, and in that otherwise only a modified first mask is used, which has a plurality of parts defining further useful areas and further scribe lines bordering the further useful area, the parts extend over the semiconductor substrate, the predetermined pattern of the first and second structures are produced in the further useful areas, and in each case a predetermined number of further ones of the first and second structures are produced in the further scribe lines.

6. The method according to claim 1, which comprises forming the first and second structures of the electronic circuit as transistors having two different gate oxide thicknesses.

7. The method according to claim 6, which comprises using the first mask for fabricating first transistors having a first gate oxide thickness, the first mask being formed such that a nitrogen implantation is carried out in gate oxide regions of the first transistors prior to an application of a gate oxide layer, which implantation inhibits a growth of the gate oxide layer subsequently applied.

8. The method according to claim 7, which comprises using the second mask for fabricating second transistors having a second gate oxide thickness being greater than the first gate oxide thickness, the second mask being formed in such a way that no nitrogen implantation is carried out in gate oxide regions of the second transistors prior to an application of the gate oxide layer.

9. The method according to claim 6, which comprises forming the electronic circuit in the semiconductor substrate to be dynamic random access memory (DRAM) structures in a silicon wafer.

* * * * *